(12) United States Patent
Jang

(10) Patent No.: US 7,425,840 B2
(45) Date of Patent: Sep. 16, 2008

(54) SEMICONDUCTOR DEVICE WITH MULTIPURPOSE PAD

(75) Inventor: Chae-Kyu Jang, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/647,150

(22) Filed: Dec. 29, 2006

(65) Prior Publication Data

US 2008/0088334 A1   Apr. 17, 2008

(30) Foreign Application Priority Data

Aug. 31, 2006   (KR) .................. 10-2006-0083743

(51) Int. Cl.
*G01R 31/26* (2006.01)
*G01R 31/28* (2006.01)
(52) U.S. Cl. .................... 324/765; 324/158.1
(58) Field of Classification Search .............. 324/765, 324/158.1; 327/534, 536
See application file for complete search history.

(56) References Cited

U.S. PATENT DOCUMENTS

| | | | | |
|---|---|---|---|---|
| 5,553,030 | A * | 9/1996 | Tedrow et al. | 365/226 |
| 5,952,872 | A * | 9/1999 | Hur | 327/535 |
| 5,999,009 | A * | 12/1999 | Mitsui | 324/765 |
| 6,071,314 | A * | 6/2000 | Baxter et al. | 716/17 |
| 6,300,839 | B1 * | 10/2001 | Bazargan et al. | 331/57 |
| 6,397,361 | B1 * | 5/2002 | Saitoh | 714/724 |
| 6,597,235 | B2 * | 7/2003 | Choi | 327/536 |
| 6,981,090 | B1 * | 12/2005 | Kutz et al. | 710/317 |
| 7,149,316 | B1 * | 12/2006 | Kutz et al. | 381/120 |

FOREIGN PATENT DOCUMENTS

KR   2000-0003218   1/2000
KR   2001-0028416   4/2001

OTHER PUBLICATIONS

Korean Notice of Allowance issued in Korean Patent Application No. KR 10-2006-0083743, mailed Sep. 21, 2007 and English Translation.
Korean Office Action issued in Korean Patent Application No. KR 10-2006-0083743, mailed Sep. 21, 2007.

* cited by examiner

*Primary Examiner*—Ha Nguyen
*Assistant Examiner*—Karen M Kusumakar
(74) *Attorney, Agent, or Firm*—McDermott Will Emery LLP

(57) ABSTRACT

It is provided a semiconductor device with an ability to receive various test signals and check test results in spite of a limited number of pads. The semiconductor device includes a signal transferring unit for transferring a power signal input through a multipurpose pad into a core area or delivering a test signal between the multipurpose pad and the core area while operating in a test mode and a test mode controlling unit for controlling the signal transferring unit to transfer one of the power voltage and the test signal.

10 Claims, 2 Drawing Sheets

SEMICONDUCTOR DEVICE WITH MULTIPURPOSE PAD

CROSS-REFERENCE TO RELATED APPLICATIONS

The present invention claims priority of Korean patent application number 10-2006-0083743, filed on Aug. 31, 2006, which is incorporated by reference in its entirety.

BACKGROUND OF THE INVENTION

The present invention relates to a semiconductor device, more particularly, to a semiconductor device with a multipurpose pad.

Considering a fabrication process for semiconductor devices, first, many semiconductor dies are created on a single wafer. Typically, several dozens or hundreds of semiconductor dies are produced on a wafer. After fabricating semiconductor dies, wafer level tests are executed to check fabricated semiconductor dies on the wafer for errors. Semiconductor dies which pass wafer level testing are sawed and packaged in plastic cases. A packaged semiconductor die is called a semiconductor device.

As demand for reducing fabrication costs for semiconductor devices grows, semiconductor manufacturers are attempting to reduce the size of semiconductor dies. As the size of semiconductor dies on a wafer decreases, the number of semiconductor dies included on the wafer increases. The more dies included in a wafer, the lower the cost for the end semiconductor device. Therefore, semiconductor dies have become smaller and smaller. In the other hand, packages for the semiconductor dies have to have a predetermined size because the package size of a semiconductor device is fitted with the size of its predetermined place on a printed circuit board (PCB), which includes the semiconductor die. In particular, the width or gap of signal lines arranged on the PCB should be matched with that of pins connected to the package of the semiconductor die.

Generally, a semiconductor die includes a plurality of pads corresponding to the package pins for the semiconductor die. The pads included in the semiconductor die are respectively coupled to input signals into and output signals from logic circuits created in the semiconductor die. Thus, through pads included in the semiconductor die, signal lines for logic circuits created in the semiconductor die are connected to signal lines arranged on a PCB.

The pads of the semiconductor die are conductive patterns arranged on space remaining between the logic circuits. The magnitudes of signals on signal lines of the logic circuits in the semiconductor die are too small compared with the load capacitances of signal lines on a PCB. Thus, the magnitudes of signals on signal lines of the logic circuits should be raised through signal output drivers to output signals and also the pads of the semiconductor die has sufficient load capacitances to correspond to load capacitances of signal lines on the PCB. Hence, the pads of the semiconductor die should occupy a relatively large area of the semiconductor die.

Typically, pads for semiconductor dies are classified into input pads for receiving signals from external signal lines, output pads for outputting signals from the logic circuits to external signal lines, power pads for supplying external power and test pads for transferring test signals during testing.

As semiconductor technology develops, the demand for carrying out more complex operations and reducing power consumption of semiconductor devices increases. Also, the number of input pads and output pads for a semiconductor device increases and the level of a power supply voltage supplied to a semiconductor device decreases more and more. As a result, the number of pads needed for receiving power signals increases. Because power signals through the power pads of a semiconductor device become more susceptible to external noises as a power supply voltage supplied to a semiconductor device decreases, the semiconductor device should include many more pads for receiving power signals. In the situation that the number of pads to be included in a semiconductor die is limited, a semiconductor device does not have a sufficient number of test pads for testing. That is, the number of test pads of a semiconductor device should be strictly limited.

When all of the pads in a semiconductor device are assigned depending on use, at first, input pads or output pads are arranged and pads for power signals are assigned. And then, the remaining pads can be assigned as test pads. The number of remaining pads assigned for the test pads is often insufficient for executing various tests.

Because the desired tests of a semiconductor device have become various and complex as semiconductor technology has developed, there is a need for an increasing number of test pads for testing a semiconductor device. However, described above, the number of available test pads has decreased. That is, because of the lack of the desired number of test pads, sufficient test signals corresponding to various tests can not be supplied to a semiconductor device under test and semiconductor manufacturers can not check test results in response to supplied test signals. If a fabricated semiconductor device has an error, it can not be thoroughly checked so as to find the error because the required number of test pads is lacking and as a result, the necessary test signals can not be supplied to a fabricated semiconductor device.

SUMMARY OF THE INVENTION

Embodiments of the present invention are directed to providing a semiconductor device with an ability to receive various test signals and check test results in spite of a limited number of pads.

In accordance with an aspect of the present invention, there is provided a semiconductor device, including a signal transferring unit for transferring a power signal supplied through a multipurpose pad into a core area or delivering a test signal between the multipurpose pad and the core area in a test mode and a test mode controlling unit for controlling the signal transferring unit to transfer one of the power signal and the test signal.

In accordance with another aspect of the present invention, there is provided a semiconductor device, including a multipurpose pad, a signal transferring unit for transferring a normal signal between the multipurpose pad and a core area while operating in a normal mode and a test signal between the multipurpose pad and the core area while operating in a test mode, and a test mode controlling unit for controlling the signal transferring unit so as to transfer one of the power voltage and the test signal.

DESCRIPTION OF SPECIFIC EMBODIMENTS

Figure 1:
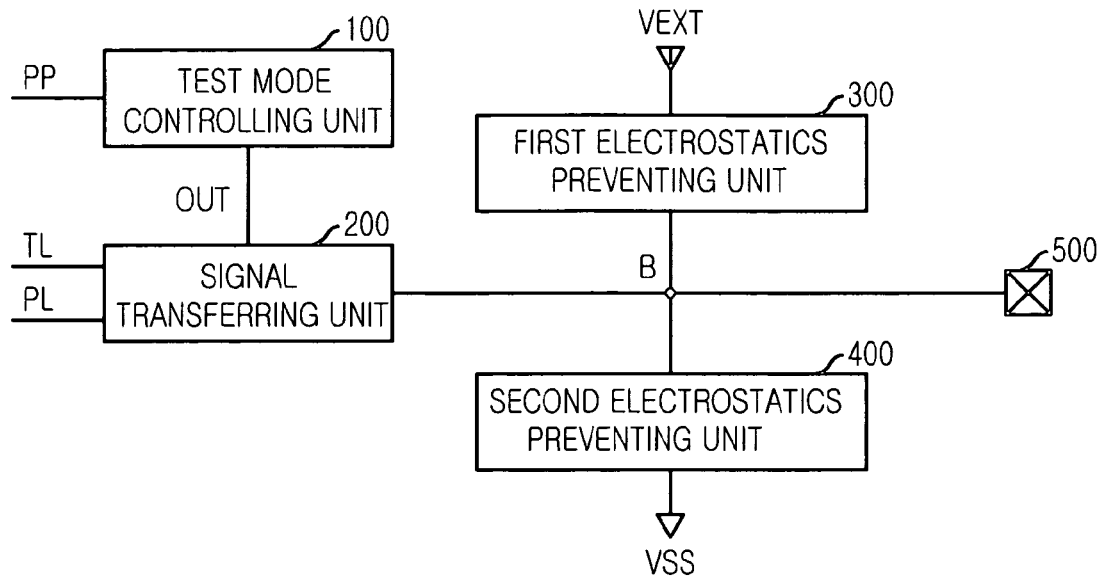
FIG. 1 shows a block diagram of an exemplary embodiment of a semiconductor device in accordance to the present invention.

FIG. 1 shows a block diagram of an exemplary embodiment of a semiconductor device in accordance to the present invention. The semiconductor device includes a test mode controlling unit 100, a signal transferring unit 200, a first electrostatics preventing unit 300, a second electrostatics preventing unit 400 and a multipurpose pad 500. The multipurpose pad 500 is used for transferring a test signal TL on test mode and for transferring a power signal PL on normal mode. The power signal may be a power supply voltage or a ground voltage VSS.

The test mode controlling unit 100 controls the signal transferring unit 200 to transfer one of the power signal PL and the test signal TL. The signal transferring unit 200 transfers the power signal PL from the multipurpose pad 500 to a core area (not shown) and the test signal TL between the multipurpose pad 500 and the core area while operating in test mode. That is, the signal transferring unit 200 receives and outputs the test signal TL having a testing result to the multipurpose pad 500, and receives a test signal from the multipurpose pad 500 to output the test signal TL.

The first electrostatics preventing unit 300 and the second electrostatics preventing unit 400 prevent electrostatics through the multipurpose pad 500 from transferring into the core area.

Figure 2:
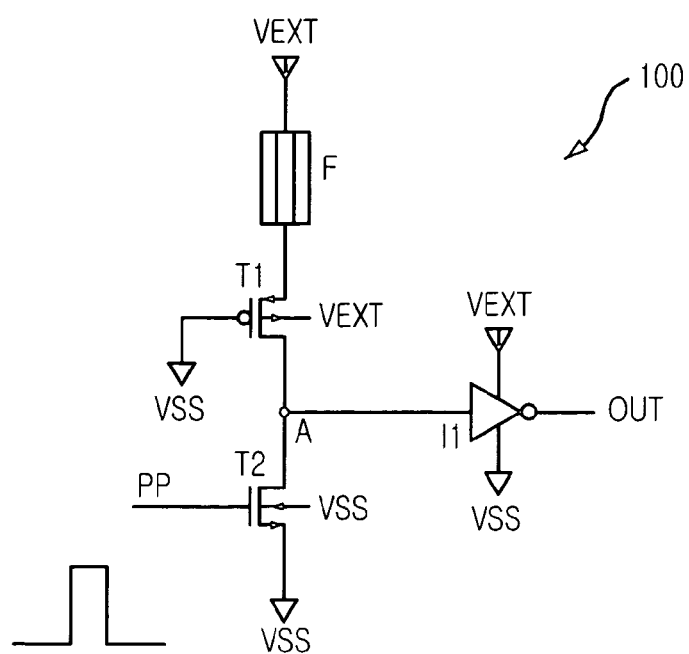
FIG. 2 shows an exemplary schematic diagram of the test mode controlling unit in FIG. 1.

FIG. 2 shows an exemplary schematic diagram of the test mode controlling unit in FIG. 1. The test mode controlling unit 100 generates a selection signal OUT for the signal transferring unit 200 for selecting one of the power signal PL and the test signal TL depending on whether a fuse F is blown or not. The test mode controlling unit 100 includes the fuse F coupled to an external power voltage VEXT, a first MOS transistor T1 having a gate connected to the ground voltage VSS and a first terminal connected to the fuse F, a second MOS transistor T2 having a gate connected to a control signal PP, a first terminal connected to the second terminal of the first MOS transistor T1 and the second terminal connected to the ground voltage VSS, and an inverter I1 for inverting a logic level of the first terminal of the second MOS transistor T2 to output the selection signal OUT.

Figure 3:
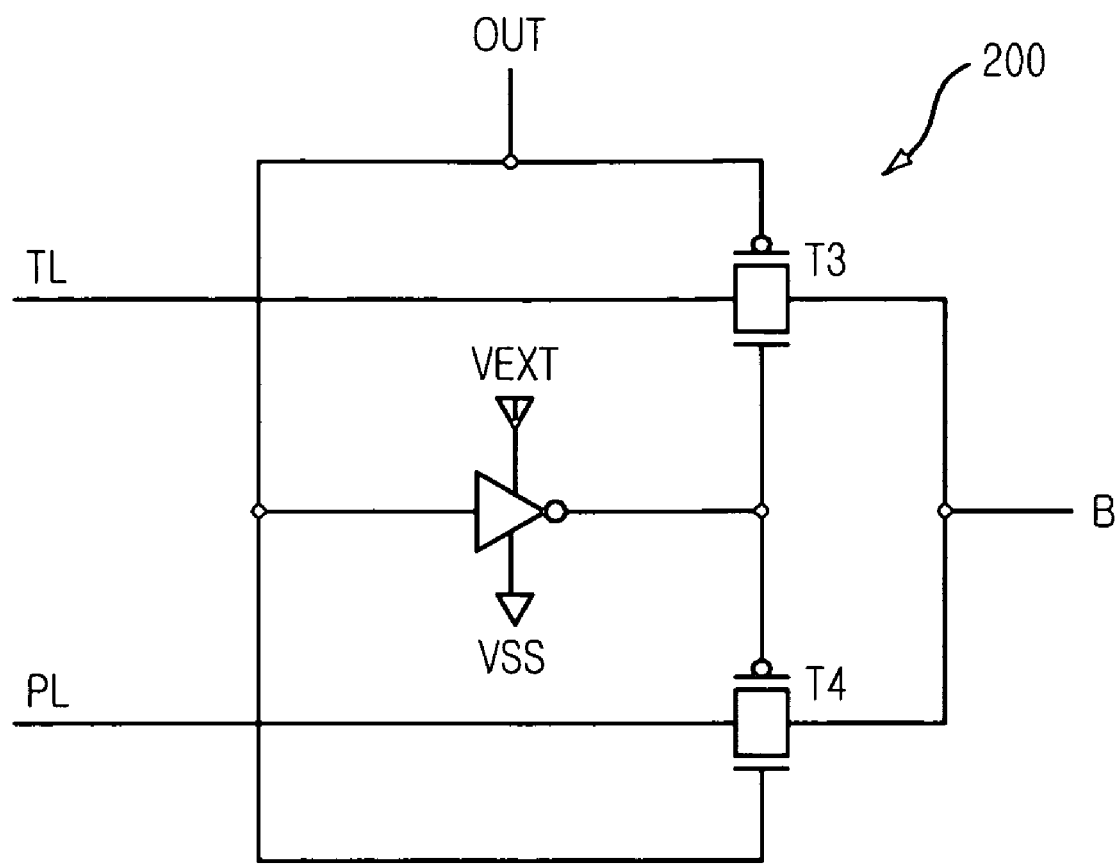
FIG. 3 shows an exemplary schematic diagram of the signal transferring unit in FIG. 1.

FIG. 3 shows an exemplary schematic diagram of the signal transferring unit in FIG. 1. The signal transferring unit 200 includes a first transmission gate T3 for transferring the test signal TL in response to a first logic level of the selection signal OUT and a second transmission gate T4 for transferring the power signal in response to a second logic level of the selection signal OUT.

The semiconductor device according to the present invention has a noticeable feature that the multipurpose pad 500 is used for transferring either a test signal or a normal signal (power signal). While operating in a test mode, a test signal from the external is transferred to the signal transferring unit 200 through the multipurpose pad 500 or a test signal having a testing result is transferred externally through the signal transferring unit 200 to the multipurpose pad 500. Alternatively, while operating in normal mode, a external power signal supplied through the multipurpose pad 500 is transferred to the signal transferring unit 200. Also, a normal signal can be transferred between the multipurpose pad 500 and the signal transferring unit 200.

The semiconductor device according to the present invention has limited pads like a conventional semiconductor device. However, the semiconductor device according to the present invention includes multipurpose pads which can receive a power signal or transfer a test signal. In a test mode, a number of test signals corresponding to various test modes can be input to the semiconductor device using the multipurpose pads and semiconductor manufacturers can receive testing signals having a test result through the multipurpose pads. Therefore, various tests of the semiconductor device can be executed although the semiconductor device has a limited number of pads.

Especially, the multipurpose pads are used for receiving power signals in this embodiment. As demand for increased operating speed and decreased levels of power supply voltage of semiconductor devices grows, the proportion of pads used for power signals included in semiconductor devices rises relatively. For instance, recently, the rate of pads for power signals in semiconductor devices has reached about 20%. The lower the level of a power supply voltage, the more pads for power signals are needed because of the increasing susceptibility of a semiconductor device to external noises. Therefore, if many pads for power signals are used for testing, many various test signals can be input to a semiconductor device. Then, various tests can be executed, corresponding testing results can be checked, and as a result, it contributes to increased yield for fabricated semiconductor devices.

Typically, the various tests of semiconductor devices can be executed on a wafer level. In order that the various tests are executed on a wafer level, the fuse F of the test mode controlling unit 100 is not blown. The selecting signal OUT has a logic low level and the transmission gate T3 of the signal transferring unit 200 is turned on. A test signal is transferred between the core area and the multipurpose pad 500.

After the conclusion of wafer level tests, the fuse F of the test mode controlling unit 100 is blown. Then, the selecting signal OUT has a logic high level and the transmission gate T4 of the signal transferring unit 200 is turned on. Then, the multipurpose pad 500 is used for transferring a power signal into the core area through the signal transferring unit 200.

In case that the semiconductor device according to the present invention is a semiconductor memory device, the multipurpose pad 500 may be used for receiving a biasing voltage which is required for the operation of the core area, a core voltage, a low voltage, a high voltage, a precharge voltage, a plate voltage, a reference voltage, a power-up signal, etc. The biasing voltage is a voltage required on an operation of the core area. The core voltage is a voltage for operating a cell area of the memory device. The low voltage is lower than a ground voltage supplied to the memory device and is usually used as a bulk bias voltage of NMOS transistors in the memory device. The high voltage is higher than a power supply voltage supplied to the memory device and is usually used as a bulk bias voltage of PMOS transistors and a turn-on voltage of NMOS transistors in the memory device. The precharge voltage is a voltage for a precharge operation. The plate voltage is a voltage supplied to a plate node of a cell array in the memory device. The reference voltage is a voltage used for comparing a voltage of the memory device. The power-up signal is a check signal generated from a power detecting circuit in the memory device.

Finally, although the semiconductor device according to the present invention has a limited number of pads, various testing signals can be input to the semiconductor device and the test results corresponding the input testing signals can be checked through multipurpose pads. Therefore, it is easier to fabricate semiconductor devices with a higher reliability by the prevent invention.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   a signal transferring unit for transferring a power signal input through a multipurpose pad into a core area or delivering a test signal between the multipurpose pad and the core area while operating in a test mode; and
   a test mode controlling unit for controlling the signal transferring unit to transfer one of the power signal and the test signal,
   wherein the test mode controlling unit includes:
   a fuse coupled to a power voltage;
   a selection signal generating unit configured to output a selection signal for transferring one of the power signal and the test signal depending on whether the fuse is blown or not.

2. The semiconductor device of claim 1, wherein the selection signal generating unit includes:
   a first MOS transistor having a gate connected to a ground voltage and a first terminal coupled to the fuse;
   a second MOS transistor having a gate connected to a control signal, a first terminal connected to the second terminal of the first MOS transistor and the second terminal connected to the ground voltage; and
   an inverter for inverting a logic level of the first terminal of the second MOS transistor to output the selection signal.

3. The semiconductor device of claim 1, wherein the signal transferring unit includes:
   a first transmission gate for transferring the test signal in response to a first logic level of the selection signal; and
   a second transmission gate for transferring the power signal in response to a second logic level of the selection signal.

4. The semiconductor device of claim 1, wherein the power signal is one of a power supply voltage and a ground voltage.

5. The semiconductor device of claim 1 further comprising an electrostatics prevention circuit between the multipurpose pad and the signal transferring unit.

6. A semiconductor device, comprising:
   a multipurpose pad;
   a signal transferring unit for transferring a normal signal between the multipurpose pad and a core area while operating in a normal mode and a test signal between the multipurpose pad and the core area while operating in a test mode; and
   a test mode controlling unit for controlling the signal transferring unit to transfer one of the normal signal and the test signal,
   wherein the test mode controlling unit includes:
   a fuse coupled to a power voltage; and
   a selection signal generating unit configured to output a selection signal for transferring one of the normal signal and the test signal depending on whether the fuse is blown or not.

7. The semiconductor device of claim 6, wherein the selection signal generating unit includes:
   a first MOS transistor having a gate connected to a ground voltage and a first terminal coupled to the fuse;
   a second MOS transistor having a gate connected to a control signal, a first terminal connected to the second terminal of the first MOS transistor and the second terminal connected to the ground voltage; and
   an inverter for inverting a logic level of the first terminal of the second MOS transistor to output the selection signal.

8. The semiconductor device of claim 6, wherein the signal transferring unit includes:
   a first transmission gate for transferring the test signal in response to a first logic level of the selection signal; and
   a second transmission gate for transferring the normal signal in response to a second logic level of the selection signal.

9. The semiconductor device of claim 3, wherein the selection signal having the first logic level is generated when the fuse is not blown.

10. The semiconductor device of claim 8, wherein the selection signal having the first logic level is generated when the fuse is not blown.

* * * * *